(12) United States Patent
Nakabayashi

(10) Patent No.: US 7,642,130 B2
(45) Date of Patent: Jan. 5, 2010

(54) MANUFACTURING METHOD OF WIRING SUBSTRATE

(75) Inventor: Yoko Nakabayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 203 days.

(21) Appl. No.: 11/760,291

(22) Filed: Jun. 8, 2007

(65) Prior Publication Data

US 2007/0292988 A1    Dec. 20, 2007

(30) Foreign Application Priority Data

Jun. 20, 2006    (JP) .............................. 2006-169981

(51) Int. Cl.
  *H05K 3/24*    (2006.01)
  *H01L 21/60*   (2006.01)
  *H05K 3/34*    (2006.01)

(52) U.S. Cl. ..................... 438/108; 29/839; 29/840; 29/890.12; 219/56

(58) Field of Classification Search .................. 438/108
  See application file for complete search history.

(56) References Cited

U.S. PATENT DOCUMENTS

| | | | | |
|---|---|---|---|---|
| 5,982,629 | A | * | 11/1999 | Shoji et al. .................. 361/760 |
| 6,077,380 | A | * | 6/2000 | Hayes et al. ................. 156/283 |
| 6,468,582 | B1 | * | 10/2002 | Sakemi ....................... 427/97.4 |
| 2004/0178149 | A1 | * | 9/2004 | Hernandez et al. .......... 210/688 |

FOREIGN PATENT DOCUMENTS

JP      2005-268353      9/2005

OTHER PUBLICATIONS

English machine translated document of Japan Patent No. 11-121907.*
English machine translated document of Japan Patent No. 07-094853.*

* cited by examiner

*Primary Examiner*—Charles D Garber
*Assistant Examiner*—Pape Sene
(74) *Attorney, Agent, or Firm*—Rankin, Hill & Clark LLP

(57)    ABSTRACT

A bonding pad and flip chip pads in which the surfaces are formed by different metals are juxtaposed on a substrate. The substrate is immersion-treated with a first adhesive treatment liquid which contains an adhesive giving compound for reacting with only a metal surface and giving adhesion properties and is adjusted to a pH value for forming adhesive layers on both of the metal surfaces of the flip chip pads and the bonding pad. Solder powder is attached to the adhesive layers formed on each of the metal surfaces of the pads. Then, the substrate is again immersion-treated with a second adhesive treatment liquid which contains an adhesive giving compound for reacting with only a metal surface and giving adhesion properties and is adjusted to a pH value for forming the adhesive layers on the metal surfaces of the flip chip pads while peeling the adhesive layer of the metal surface of the bonding pad. Subsequently, the solder powder attached to only the flip chip pads is melted by performing reflow after the solder powder is attached to the adhesive layers formed on only the flip chip pads.

7 Claims, 4 Drawing Sheets

FIG. 5A
FIG. 5B
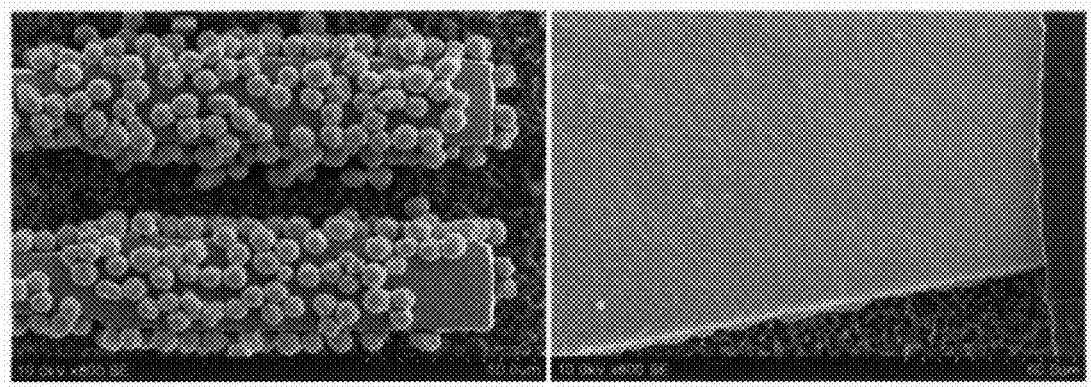
FIG. 6A
FIG. 6B
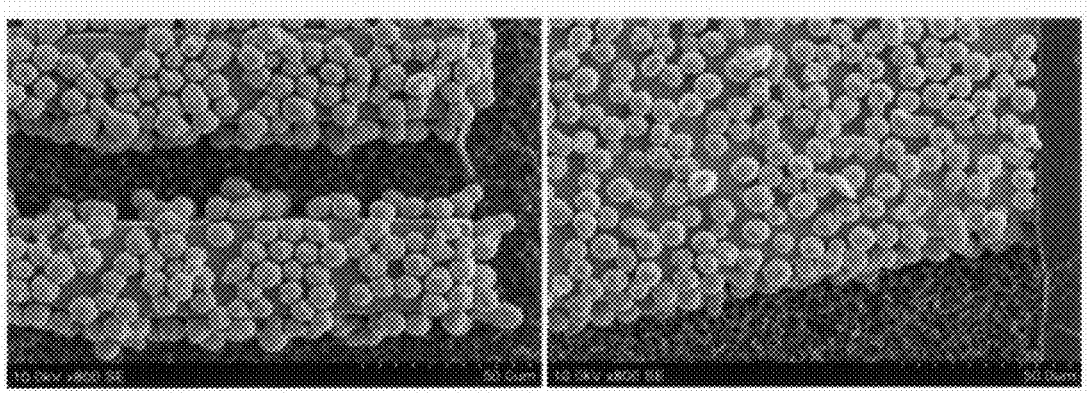
FIG. 7A
FIG. 7B
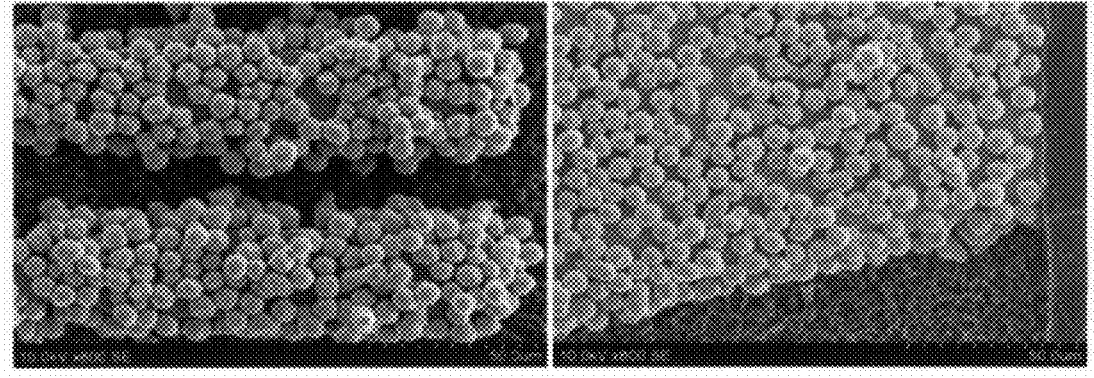

MANUFACTURING METHOD OF WIRING SUBSTRATE

This application claims priority to Japanese Patent Application No. 2006-169981, filed Jun. 20, 2006, in the Japanese Patent Office. The priority application is incorporated by reference in its entirety.

TECHNICAL FIELD

The present disclosure relates to a manufacturing method of a wiring substrate, and relates to a manufacturing method of a wiring substrate on which a bonding pad for wire bonding connection and a flip chip pad for flip chip connection in which solder is deposited on a surface are juxtaposed.

RELATED ART

In a wiring substrate on which flip chip connection of a semiconductor element is made, flip chip pads 102, 102 . . . for flip chip connection and a bonding pad 104 for wire bonding connection may be juxtaposed on one surface of a substrate 100 as shown in FIG. 8.

A solder layer for fastening an electrode terminal of the abutting semiconductor element is formed in such flip chip pads 102, 102 . . . and a surface of the bonding pad 104 for wire bonding connection is formed in a noble metal surface so as to improve bonding properties. This noble metal surface is exposed from a solder resist layer 105.

In this manner, each of the surfaces of the flip chip pads 102, 102 . . . and the bonding pad 104 is formed by different metals and when the solder layer is formed on metal surfaces of the flip chip pads 102, 102 . . . , it is necessary to prevent solder from adhering to the noble metal surface of the bonding pad 104.

As a result of this, as shown in FIGS. 9A to 9E, a method for covering a noble metal surface on which noble metal plating of a bonding pad 104 is performed with a mask plate 200 and forming a solder layer on metal surfaces of flip chip pads 102, 102 . . . has been proposed in Japanese Patent Unexamined Publication No. 2005-268353.

In other words, a substrate 100 in which the noble metal surface of the bonding pad 104 is covered with the mask plate 200 is first immersion-treated with an adhesive treatment liquid into which an adhesive giving compound for forming an adhesive layer on only a metal surface is blended, and adhesive layers 106 with which each of the surfaces of the flip chip pads 102, 102 . . . is covered are formed as shown in FIG. 9A.

After this substrate 100 is sprinkled with solder powder and the solder powder 108, 108 . . . is attached to each of the surfaces of the adhesive layers 106, 106 . . . , the solder powder 108, 108 . . . attaches to only each of the surfaces of the adhesive layers 106, 106 . . . as shown in FIG. 9B by shaking off the extra solder powder.

Next, after the mask plate 200 is removed and flux 110 is applied, the solder powder 108, 108 . . . is melted by reflow and solder layers 112 with which each of the surfaces of the flip chip pads 102, 102 . . . is covered are formed (FIGS. 9C and 9D).

Thereafter, by removing the flux 110, a wiring substrate in which each of the metal surfaces of the flip chip pads 102, 102 . . . is covered with the solder layers 112 and also the noble metal surface of the bonding pad 104 is exposed can be obtained (FIG. 9E).

According to the manufacturing method of the wiring substrate proposed in 2005-268353, the wiring substrate in which each of the surfaces of the flip chip pads 102, 102 . . . is covered with the solder layers 112 and also the noble metal surface of the bonding pad 104 is exposed can be obtained.

However, covering the noble metal surface of the bonding pad 104 with the mask plate 200 results in an increase in the number of steps of a manufacturing step of the wiring substrate and the manufacturing step of the wiring substrate becomes complicated.

SUMMARY

Exemplary embodiments of the present invention provide a manufacturing method of a wiring substrate capable of easily forming a solder layer on only a surface of a flip chip pad in a substrate on which the flip chip pad and a bonding pad are juxtaposed.

The present inventor found that an adhesive layer is resistant to being formed on a noble metal surface made of noble metal such as gold depending on a pH value of an adhesive treatment liquid with which the substrate 100 shown in FIG. 9A is immersion-treated as compared with a copper surface, and reached the present invention.

That is, an exemplary embodiment of the present invention is a manufacturing method of a wiring substrate, characterized in that in the case of manufacturing a wiring substrate on which a bonding pad for wire bonding connection and a flip chip pad for flip chip connection in which solder is deposited on a surface are juxtaposed, each of the metal surfaces of the flip chip pad and the bonding pad is formed by different metals, and then the substrate is immersion-treated with a first adhesive treatment liquid which contains an adhesive giving compound for reacting with only a metal surface and giving adhesion properties and is adjusted to a pH value for selectively forming an adhesive layer on each of the metal surfaces of the pads and solder powder is attached to the adhesive layer formed on each of the metal surfaces of the pads, and subsequently the substrate immersion-treated with the first adhesive treatment liquid is again immersion-treated with a second adhesive treatment liquid which contains an adhesive giving compound for reacting with only a metal surface and giving adhesion properties and is adjusted to a pH value capable of forming an adhesive layer on the metal surface of the flip chip pad while peeling the adhesive layer formed on the metal surface of the bonding pad, and thereafter a solder layer with which the metal surface of the flip chip pad is covered is formed by melting solder powder by reflow after the solder powder is attached to the adhesive layer formed on only the metal surface of the flip chip pad.

In such an exemplary embodiment of the preset invention, each of the pH values of the first adhesive treatment liquid and the second adhesive treatment liquid is adjusted in the range of 4 to 6 and in that case, the pH value of the second adhesive treatment liquid is adjusted so as to become higher than the pH value of the first adhesive treatment liquid. Particularly, the pH value of the second adhesive treatment liquid is adjusted so as to become higher than the pH value of the first adhesive treatment liquid by 0.5 or more. Therefore, an adhesive layer with a sufficient film thickness can be formed on a metal surface of a flip chip pad and sufficient solder powder can be attached and also, the solder powder can be prevented from attaching to a metal surface of a bonding pad.

Also, solder powder with a particle size smaller than that of solder powder attached to the adhesive layer formed on the metal surface by being immersion-treated with the first adhesive treatment liquid is used as solder powder attached to the adhesive layer formed on the metal surface by being immersion-treated with the second adhesive treatment liquid. Therefore, sufficient solder powder can be more attached to a surface of a flip chip pad.

Further, the metal surface of the bonding pad is preferably formed by noble metal surface, particularly a noble metal surface made of gold, palladium or silver, and the surface of the flip chip pad is preferably formed by a copper surface.

One or more embodiments of the present invention may include one or more the following advantages. For example,in the exemplary embodiment of the present invention, an adhesive layer formed on a metal surface of a bonding pad among the adhesive layers formed on both surfaces of a flip chip pad and the bonding pad by immersion-treating a substrate with a first adhesive treatment liquid is peeled from the metal surface of the bonding pad in the case of immersion-treating this substrate with a second adhesive treatment liquid, and the metal surface of the bonding pad can be exposed.

On the other hand, the adhesive layer formed on a metal surface of the flip chip pad and solder powder attached to this adhesive layer are not peeled even when the substrate is immersion-treated with the second adhesive treatment liquid, and the adhesive layer can be formed on the metal surface of the flip chip pad by immersion-treatment with the second adhesive treatment liquid. By sprinkling the adhesive layer formed in this manner with solder powder, the solder powder can be uniformly and sufficiently attached to the metal surface of the flip chip pad combined with the solder powder attached previously.

According to such an exemplary embodiment of the present invention, there is no need to cover the bonding pad with a mask plate and a step of mounting to and demounting from the mask plate can be omitted and a manufacturing step of a wiring substrate can be simplified.

Further, according to the exemplary embodiment of the present invention, a step of immersion-treating the substrate with the adhesive treatment liquid and attaching the solder powder to the adhesive layer formed on the flip chip pad is performed at least two times, so that sufficient solder powder can be attached to the flip chip pad and a film thickness of a solder layer formed finally can be thickened. As a result of this, when flip chip connection between a semiconductor element and the obtained wiring substrate is made, the semiconductor element can surely be connected to the wiring substrate and reliability of a semiconductor apparatus obtained finally can be improved.

Other features and advantages maybe apparent from the following detailed description, the accompanying drawings and the claims.

BRIEF DESCRIPTION OF THE DRAWINGS

FIGS. 5A, 5B are electron microscope photographs showing a state of a flip chip pad 12 and a bonding pad 14 of a substrate 10 obtained in Comparative Example 2.

FIGS. 6A, 6B are electron microscope photographs showing a state of a flip chip pad 12 and a bonding pad 14 of a substrate 10 obtained in Comparative Example 3.

FIGS. 7A, 7B are electron microscope photographs showing a state of a flip chip pad 12 and a bonding pad 14 of a substrate 10 obtained in Comparative Example 4.

DETAILED DESCRIPTION

Figure 1A:
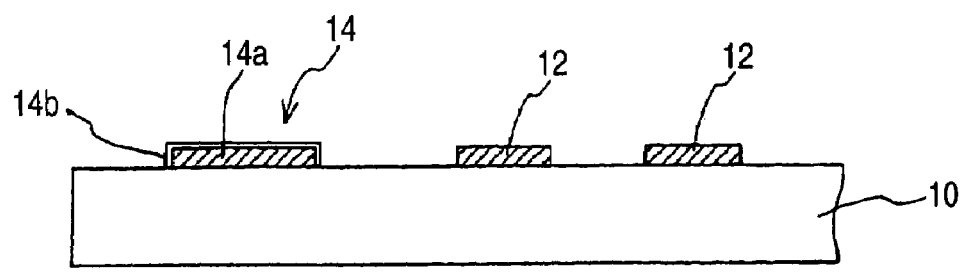
FIGS. 1A to 1C are step diagrams describing a manufacturing method of a wiring substrate according to the present invention.

In an exemplary embodiment of the present invention, a substrate 10 on which flip chip pads 12, 12 . . . and a bonding pad 14 are juxtaposed on the same surface is used as shown in FIG. 1A. Such a substrate 10 is formed of an insulating material such as resin or ceramics, and the flip chip pads 12, 12 . . . are formed of copper.

Also, in the bonding pad 14, a metal layer 14b is formed so as to cover a body part 14a made of copper. In this metal layer 14b, a gold layer used as a noble metal layer is formed on a nickel layer used as an underlaying metal layer. The nickel layer used as this underlaying metal layer and the gold layer used as the noble metal layer can also be formed by evaporation, and can easily be formed by metal plating.

Such a substrate 10 is immersion-treated with a first adhesive treatment liquid which contains an adhesive giving compound for reacting with only a metal surface and giving adhesion properties and is adjusted to a pH value for selectively forming adhesive layers on both metal surfaces of the flip chip pads 12 and the bonding pad 14. Then, the substrate 10 is sprinkled with solder powder.

Figure 1B:
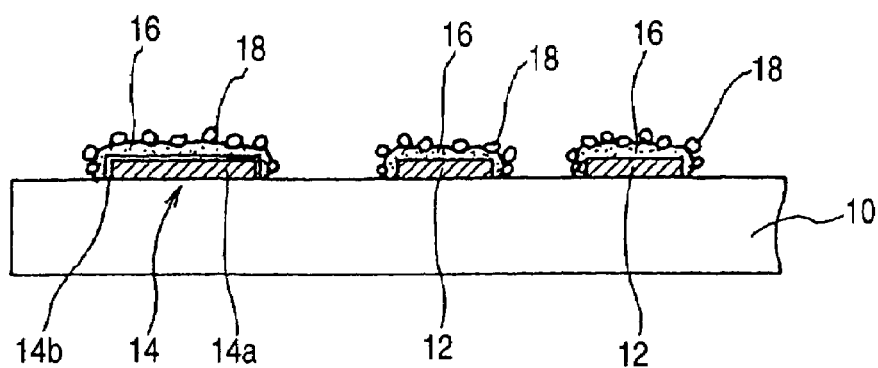

By shaking off and removing the extra solder powder among the sprinkled solder powder, solder powder 18, 18 . . . is attached to adhesive layers 16 formed so as to cover both metal surfaces of the flip chip pads 12 and the bonding pad 14 as shown in FIG. 1B.

As the first adhesive treatment liquid, an adhesive treatment liquid described in Japanese Patent No. 2592757 can be adopted and as the adhesive giving compound, at least one kind selected from the group of a naphthotriazole derivative, a benzotriazole derivative, an imidazole derivative, a benzimidazole derivative, a mercaptobenzothiazole derivative and a benzothiazole thio fatty acid derivative can be used.

A pH value of this first adhesive treatment liquid varies depending on a kind of the substrate 10, and is preferably adjusted to weak acidity of 4 to 6. Alkali such as sodium hydroxide can be used in adjustment of the pH value. When the pH value of the first adhesive treatment liquid is higher than 6, an adhesive layer with which a copper surface of the flip chip pad 12 is covered can be formed, but there is a tendency to become difficult to substantially form an adhesive layer with which a gold surface of the bonding pad 14 is covered. However, in this case, film quality of the adhesive layer with which the copper surface of the flip chip pad 12 is covered is worse than an adhesive layer formed by immersion-treating the substrate 10 with the first adhesive treatment liquid adjusted to the pH value of 4 to 6 and there is a tendency for the adhesive layer to be peeled.

On the other hand, when the pH value of the first adhesive treatment liquid is lower than 4, there is a tendency to become difficult to form the adhesive layers on the copper surface of the flip chip pad 12 and the gold surface of the bonding pad 14.

In the exemplary embodiment of the present invention, the substrate 10 shown in FIG. 1B is again immersion-treated with a second adhesive treatment liquid which contains an adhesive giving compound for reacting with only a metal surface and giving adhesion properties and is adjusted to a pH value capable of forming the adhesive layers 16 on the copper surfaces of the flip chip pads 12 while peeling the adhesive layer 16 formed on the gold surface of the bonding pad 14. Then, the substrate 10 is sprinkled with solder powder.

Figure 1C:
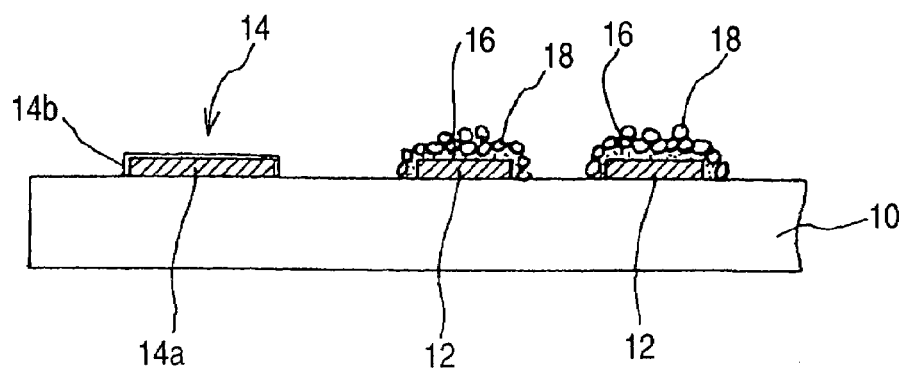

By shaking off and removing the extra solder powder among the sprinkled solder powder, the solder powder 18, 18 . . . is attached to the adhesive layers 16 formed so as to cover the copper surfaces of the flip chip pads 12 while exposing the gold surface of the bonding pad 14 as shown in FIG. 1C. The solder powder 18, 18 . . . uniformly attaches to the adhesive layers 16 with which the copper surfaces of the flip chip pads 12 shown in this FIG. 1C are covered as compared with the adhesive layers 16 shown in FIG. 1B.

As this second adhesive treatment liquid, an adhesive treatment liquid with the same component as that of the first adhesive treatment liquid can be used, and its pH value is preferably adjusted to a pH value which is in the range of 4 to 6 and is higher than that of the first adhesive treatment liquid, particularly higher than that of the first adhesive treatment liquid by 0.5 or more.

When the second adhesive treatment liquid in which a pH value difference between the first and second adhesive treatment liquids is less than 0.5 is used as the second adhesive treatment liquid herein, there is a tendency to insufficiently peel the adhesive layer 16 formed on the gold surface of the bonding pad 14.

Also, as a solder powder sprinkled after the substrate 10 is again immersion-treated with the second adhesive treatment liquid, a solder powder with a particle size smaller than that of a solder powder sprinkled after the substrate 10 is immersion-treated with the first adhesive treatment liquid is used. Therefore, the solder powder 18, 18 . . . can be attached to the adhesive layers 16 with which the copper surfaces of the flip chip pads 12 shown in FIG. 1C are covered at a higher density and this is preferable.

By applying flux to surfaces on which the bonding pad 14 and the flip chip pads 12 of the substrate 10 shown in FIG. 1C are formed and performing reflow, the solder powder 18, 18 . . . attached to only the flip chip pads 12 can be melted to form solder layers with which the copper surfaces of the flip chip pads 12 are covered.

In the substrate 10 formed in this manner, each of the copper surfaces of the flip chip pads 12, 12 . . . can be covered with the solder layers in a state of exposing the gold surface of the bonding pad 14. As a result of that, flip chip connection between a semiconductor element and each of the solder layers of the flip chip pads 12, 12 . . . of the substrate 10 can be made and wire bonding to the gold surface of the bonding pad 14 of the substrate 10 can be made.

By the way, when treatment for sprinkling the adhesive layers formed on the copper surfaces of the flip chip pads 12, 12 . . . with solder powder after the substrate 10 is immersion-treated with the adhesive treatment liquid is performed only one time as described in 2005-268353, the solder powder attached to the adhesive layers tends to decrease as the flip chip pads 12, 12 . . . are miniaturized.

In this respect, as described in the exemplary embodiment of the present invention, treatment for sprinkling the adhesive layers formed on the copper surfaces of the flip chip pads 12, 12 . . . with solder powder after the substrate 10 is immersion-treated with the adhesive treatment liquid is repeated at least two times and thereby, the solder powder uniformly attaches to the adhesive layers and also there is the portion in which the solder powder attaches to an upper surface of the flip chip pad 12 in two layers. As a result of this, a sufficient amount of solder powder can be attached even to the flip chip pads 12, 12 . . . miniaturized.

Moreover, there is little portion in which the solder powder attaches to the sides of this flip chip pad 12 in two layers, and the adjacent flip chip pads 12, 12 . . . are not short-circuited by solder even in the case of performing reflow.

In the above description, the surface of the bonding pad 14 has been formed by the gold surface, but the surface of the bonding pad 14 may be formed by a palladium surface or a silver surface.

Also, the exemplary embodiment of the present invention can be applied even when the flip chip pad 12 and the bonding pad 14 are formed on different surfaces of the substrate 10.

EXAMPLE 1

A substrate 10 shown in FIG. 1A was prepared. Flip chip pads 12, 12 . . . and a bonding pad 14 are formed on the same surface of this substrate 10. This flip chip pad 12 is formed by copper. Also, in the bonding pad 14, a body part 14a made of copper is covered with a plated layer 14b made by forming a gold plated layer on a nickel plated layer used as an underlaying plated layer.

Further, a first adhesive treatment liquid in which a pH value of SJ-CH1000 (trade name) manufactured by Showa Denko K.K. used as an adhesive treatment liquid was adjusted to 4 to 4.5 and a second adhesive treatment liquid adjusted to a pH value higher than the pH value of the first adhesive treatment liquid by 0.5 were prepared.

Then, after the substrate 10 was immersion-treated with the first adhesive treatment liquid and the substrate 10 taken out of the first adhesive treatment liquid was sprinkled with solder powder with the average particle size of 7 μm, the extra solder powder was shaken off and removed.

Further, after the substrate 10 was again immersion-treated with the second adhesive treatment liquid and the substrate 10 taken out of the second adhesive treatment liquid was sprinkled with solder powder with the average particle size of 7 μm, the extra solder powder was shaken off and removed.

Figure 2A:
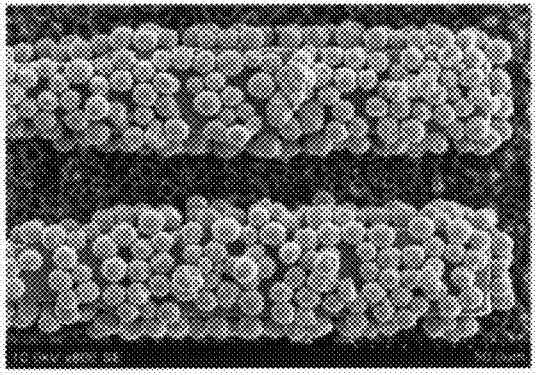
FIGS. 2A, 2B are electron microscope photographs showing a state of a flip chip pad 12 and a bonding pad 14 of a substrate 10 obtained in Example 1.
Figure 2B:
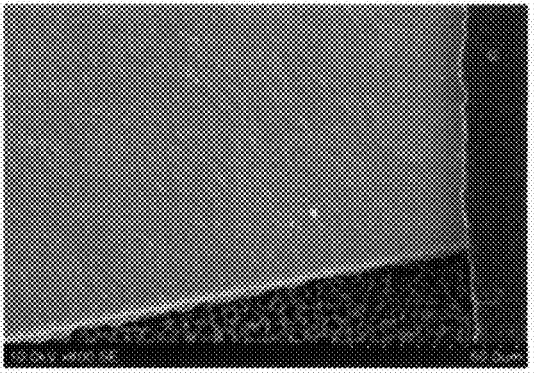

FIGS. 2A, 2B show electron microscope photographs of the flip chip pad 12 and the bonding pad 14 of the substrate 10 in which a step of sprinkling the substrate with the solder powder after immersion-treating the substrate 10 with the adhesive treatment liquid was performed two times in this manner. FIG. 2A is the photograph for the flip chip pad 12, and FIG. 2B is the photograph for the bonding pad 14.

As is evident from FIGS. 2A, 2B, the solder powder attaches to the whole surface of the flip chip pad 12 and there is also the portion in which particles of the solder powder attach double on the flip chip pad 12. On the other hand, the solder powder does not attach to the bonding pad 14 and a surface of the bonding pad 14 is exposed.

An attachment thickness of the solder powder attaching to this flip chip pad 12 was about 13.4 μm.

Only the flip chip pad 12 could be covered with a solder layer by performing reflow with respect to the substrate 10 after flux was applied to a surface of the substrate 10 on which the bonding pad 14 and the flip chip pad 12 of a state shown in FIGS. 2A, 2B were formed.

EXAMPLE 2

Sprinkling treatment of solder powder and immersion-treatment of a substrate 10 with an adhesive treatment liquid were performed in a manner similar to Example 1 except that solder powder with the average particle size of 7 μm was used as solder powder sprinkled on the substrate 10 after immersion-treatment with the first adhesive treatment liquid and solder powder with the average particle size of 5.5 μm was used as solder powder sprinkled on the substrate 10 after immersion-treatment with the second adhesive treatment liquid in Example 1.

Figure 3A:
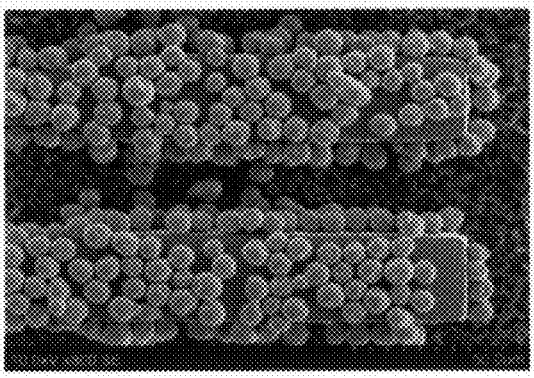
FIGS. 3A, 3B are electron microscope photographs showing a state of a flip chip pad 12 and a bonding pad 14 of a substrate 10 obtained in Example 2.
Figure 3B:
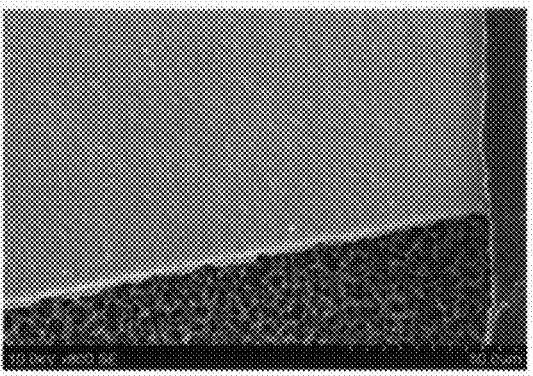

FIGS. 3A, 3B show electron microscope photographs of a flip chip pad 12 and a bonding pad 14 of the substrate 10 in which a step of sprinkling the substrate with the solder powder after immersion-treating the substrate 10 with the adhesive treatment liquid was performed two times in this manner. FIG. 3A is the photograph for the flip chip pad 12, and FIG. 3B is the photograph for the bonding pad 14.

As is evident from FIGS. 3A, 3B, the solder powder attaches to the whole surface of the flip chip pad 12 and there is also the portion in which the solder powder with a small particle size attaches between the solder powder with a large particle size. On the other hand, the solder powder does not attach to the bonding pad 14 and a surface of the bonding pad 14 is exposed.

Only the flip chip pad 12 could be covered with a solder layer by performing reflow with respect to the substrate 10 after flux was applied to a surface of the substrate 10 on which the bonding pad 14 and the flip chip pad 12 of a state shown in FIGS. 3A, 3B were formed.

COMPARATIVE EXAMPLE 1

In Example 1, after a substrate 10 was immersion-treated with a first adhesive treatment liquid and the substrate 10 taken out of the first adhesive treatment liquid was sprinkled with solder powder with the average particle size of 7 μm, the extra solder powder was shaken off and removed.

Figure 4A:
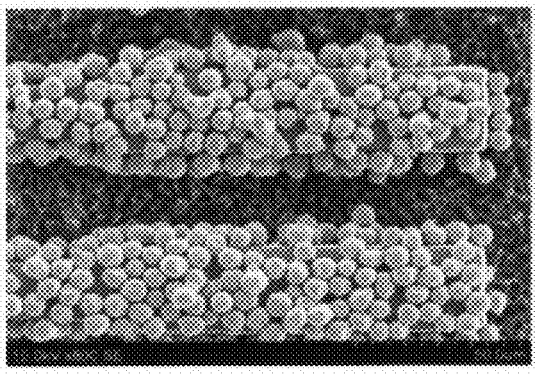
FIGS. 4A, 4B are electron microscope photographs showing a state of a flip chip pad 12 and a bonding pad 14 of a substrate 10 obtained in Comparative Example 1.
Figure 4B:
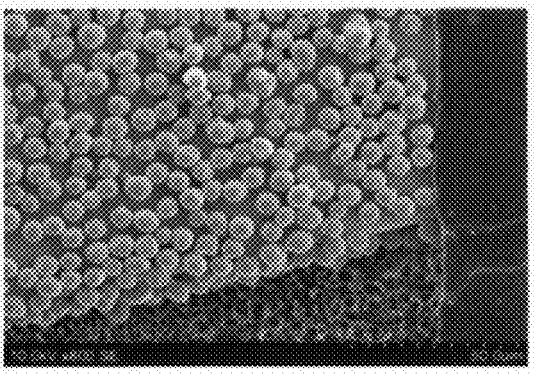
Figure 8:
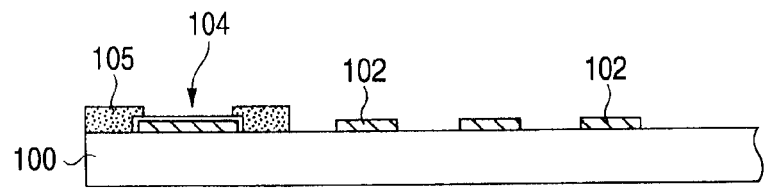
FIG. 8 is a schematic diagram of a substrate used in a manufacturing method of a related-art wiring substrate.
Figure 9A:
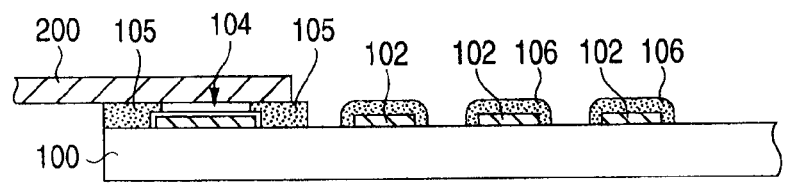
FIGS. 9A to 9E are step diagrams describing the manufacturing method of the related-art wiring substrate.
Figure 9B:
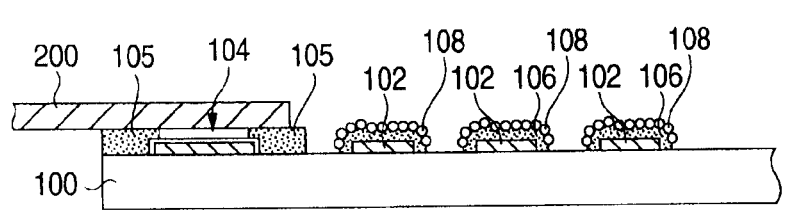
Figure 9C:
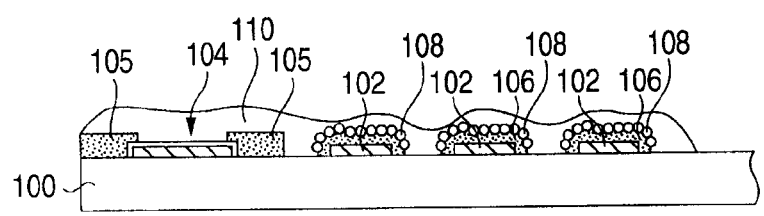
Figure 9D:
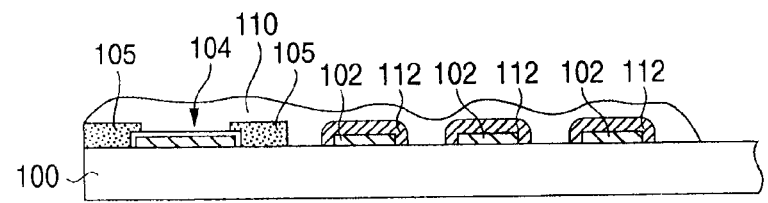
Figure 9E:
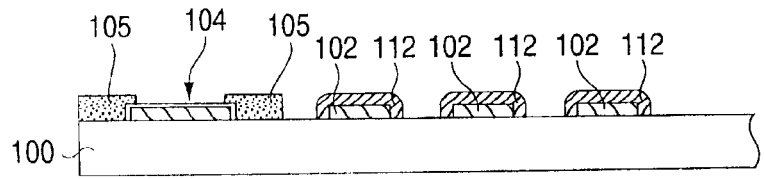

FIGS. 4A, 4B show electron microscope photographs of a flip chip pad 12 and a bonding pad 14 of the substrate 10 without again immersion-treating this substrate 10 with a second adhesive treatment liquid. FIG. 4A is the photograph for the flip chip pad 12, and FIG. 4B is the photograph for the bonding pad 14.

As is evident from FIGS. 4a, 4B, the solder powder attaches to the whole surface of the flip chip pad 12 and the bonding pad 14. As a result of this, performing reflow with respect to the substrate 10 is stopped.

In addition, an attachment thickness of the solder powder attaching to the flip chip pad 12 was about 6.2 μm.

COMPARATIVE EXAMPLE 2

In Example 1, after a substrate 10 was immersion-treated with a second adhesive treatment liquid without immersion-treating the substrate 10 with a first adhesive treatment liquid and the substrate 10 taken out of the second adhesive treatment liquid was sprinkled with solder powder with the average particle size of 7 μm, the extra solder powder was shaken off and removed.

FIGS. 5A, 5B show electron microscope photographs of a flip chip pad 12 and a bonding pad 14 of this substrate 10. FIG. 5A is the photograph for the flip chip pad 12, and FIG. 5B is the photograph for the bonding pad 14.

As is evident from FIGS. 5A, 5B, the solder powder does not attach to the bonding pad 14, but the quantity of the solder powder attaching to the flip chip pad 12 is smaller than Example 1 and Example 2.

In addition, an attachment thickness of the solder powder attaching to the flip chip pad 12 was about 7.7 μm.

COMPARATIVE EXAMPLE 3

In Example 1, after a substrate 10 was immersion-treated with a first adhesive treatment liquid and the substrate 10 taken out of the first adhesive treatment liquid was sprinkled with solder powder with the average particle size of 7 μm, the extra solder powder was shaken off and removed (immersion-treating time of the first adhesive treatment liquid is three times that of Example 1).

FIGS. 6A, 6B show electron microscope photographs of a flip chip pad 12 and a bonding pad 14 of the substrate 10 without again immersion-treating this substrate 10 with a second adhesive treatment liquid. FIG. 6A is the photograph for the flip chip pad 12, and FIG. 6B is the photograph for the bonding pad 14.

As is evident from FIGS. 6A, 6B, the solder powder attaches to the whole surface of the flip chip pad 12 and the bonding pad 14 and also, attachment of the solder powder to a substrate surface of the substrate 10 is seen.

When reflow is performed with respect to the substrate 10 of a state shown in FIGS. 6A, 6B, it becomes a cause of a solder bridge in which a gap between the flip chip pads 12 is short-circuited by solder.

COMPARATIVE EXAMPLE 4

In Example 1, a step of shaking off and removing the extra solder powder after a substrate 10 was immersion-treated with a first adhesive treatment liquid and the substrate 10 taken out of the first adhesive treatment liquid was sprinkled with solder powder with the average particle size of 7 μm was repeated three times. FIGS. 7A, 7B show electron microscope photographs of a flip chip pad 12 and a bonding pad 14 of this substrate 10. FIG. 7A is the photograph for the flip chip pad 12, and FIG. 7B is the photograph for the bonding pad 14.

As is evident from FIGS. 7A, 7B, the solder powder attaches to the whole surface of the flip chip pad 12 and the bonding pad 14. As a result of this, performing reflow with respect to the substrate 10 is stopped.

EXAMPLE 3

Sprinkling treatment of solder powder and immersion-treatment of a substrate 10 with an adhesive treatment liquid were performed in a manner similar to Example 1 except that each of the pH values of the first adhesive treatment liquid and the second adhesive treatment liquid was changed as shown in the following Table 1 in Example 1.

With respect to the substrate 10 in which a series of treatment was ended, a state of attachment of the solder powder to a substrate surface, a flip chip pad 12 and a bonding pad 14 was visually observed and its evaluation result was together shown in Table 1.

TABLE 1

| No. | First adhesive treatment liquid | Second adhesive treatment liquid | Substrate surface | Flip chip pad | Bonding pad |
| --- | --- | --- | --- | --- | --- |
| 1 | 4.3 | +1.0 | ◯ | ◯ | ◯ |
| 2 | 5.5 | +0.5 | ◯ | ◯ | ◯ |

TABLE 1-continued

| No. | First adhesive treatment liquid | Second adhesive treatment liquid | Substrate surface | Flip chip pad | Bonding pad |
|---|---|---|---|---|---|
| 3 | 5.0 | +0.5 | ○ | Δ (Note 2) | ○ |
| 4 | 4.0 | +0.2 | ○ | ○ | Δ~X (Note 3) |

Note 1)
○; Solder powder does not attach to a substrate surface and a bonding pad, and sufficient solder powder attaches to a flip chip pad.
Δ; Acceptable though there is some problem.
X; Rejection
Note 2)
Acceptable though the amount of solder powder attaching to a flip chip pad tends to decrease.
Note 3) Acceptable though solder powder attaching to a bonding pad tends to be present somewhat.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A manufacturing method of a wiring substrate on which a bonding pad for wire bonding connection and a flip chip pad for flip chip connection in which solder is deposited on a surface are juxtaposed, the method comprising steps of:
   forming metal surfaces for the flip chip pad and the bonding pad with different metals;
   immersion-treating the substrate with a first adhesive treatment liquid, the first adhesive treatment liquid including an adhesive giving compound for reacting with the metal surfaces and giving adhesion properties and being adjusted to a pH value for selectively forming an adhesive layer on each metal surface of each pad;
   attaching a solder powder to the adhesive layer formed on each metal surface of each pad;
   immersion-treating the substrate immersion-treated with the first adhesive treatment liquid with a second adhesive treatment liquid, the second adhesive treatment including an adhesive giving compound for reacting with the metal surfaces and giving adhesion properties and being adjusted to a pH value capable of forming an adhesive layer on the metal surface of the flip chip pad while peeling the adhesive layer formed on the metal surface of the bonding pad, the pH value of the second adhesive treatment liquid being adjusted so as to become higher than the pH value of the first adhesive treatment liquid;
   attaching a solder powder to the adhesive layer formed on only the metal surface of the flip chip pad; and
   forming a solder layer with which the metal surface of the flip chip pad is covered by melting the solder powder by reflow.

2. A manufacturing method of a wiring substrate as claimed in claim 1, wherein each of the pH values of the first adhesive treatment liquid and the second adhesive treatment liquid is adjusted in the range of 4 to 6.

3. A manufacturing method of a wiring substrate as claimed in claim 1, wherein the pH value of the second adhesive treatment liquid is adjusted so as to become higher than the pH value of the first adhesive treatment liquid by 0.5 or more.

4. A manufacturing method of a wiring substrate as claimed in claim 1, wherein the solder powder attached to the adhesive layer formed on the metal surface after the second adhesive treatment has a particle size smaller than a particle size of the solder powder attached to the adhesive layer formed on the metal surface after the first adhesive treatment.

5. A manufacturing method of a wiring substrate as claimed in claim 1, wherein the metal surface of the bonding pad is formed by noble metal.

6. A manufacturing method of a wiring substrate as claimed in claim 1, wherein the metal surface of the bonding pad is plated with a noble metal, gold, palladium or silver.

7. A manufacturing method of a wiring substrate as claimed in claim 1, wherein the metal surface of the flip chip pad is formed by a copper surface.

* * * * *